United States Patent [19]

Lockard

[11] 4,407,555
[45] Oct. 4, 1983

[54] CAM ACTUATED DIP TEST SOCKET

[75] Inventor: Joseph L. Lockard, Harrisburg, Pa.

[73] Assignee: AMP Incorporated, Harrisburg, Pa.

[21] Appl. No.: 245,303

[22] Filed: Mar. 19, 1981

[51] Int. Cl.³ .................................... H01R 13/193
[52] U.S. Cl. ............................................. 339/75 M
[58] Field of Search ............... 339/17 CF, 74, 75 R, 339/75 M, 75 MP; 324/158 F

[56] References Cited

U.S. PATENT DOCUMENTS

| | | | |
|---|---|---|---|
| 257,794 | 5/1882 | Weitzel | 269/48.1 |
| 3,448,345 | 6/1969 | Koehler, Jr. et al. | 339/17 |
| 3,525,972 | 8/1970 | Asick et al. | 339/64 |
| 3,649,950 | 3/1972 | Gluntz | 339/17 CF |
| 3,696,323 | 10/1972 | Kinkaid et al. | 339/192 R |
| 3,715,662 | 2/1973 | Richelmann | 339/75 M |
| 3,848,222 | 11/1974 | Lightner | 339/75 M |
| 3,883,207 | 5/1975 | Tomkiewicz | 339/75 M |
| 4,200,349 | 4/1980 | Holland | 339/75 MP |

FOREIGN PATENT DOCUMENTS 2039160  7/1980  United Kingdom ............ 339/75 M
228731  6/1969  U.S.S.R. .......................... 339/75 M
513430  6/1976  U.S.S.R. ......................... 339/75 MP

OTHER PUBLICATIONS

IBM Bulletin, Evans, vol. 11, No. 11, p. 1443, 4–1969.

Primary Examiner—Neil Abrams
Attorney, Agent, or Firm—Richard B. O'Planick; Adrian J. LaRue

[57] ABSTRACT

A DIP test socket is disclosed to provide a zero entry force receptacle for dual in-line packages. The receptacle comprises a transport block receiving a DIP package thereon, with rows of contact legs positioned to depend adjacent the sides of the transport block. A housing block is disclosed, loaded with dual parallel rows of contact members having upwardly directed spring finger portions receiving the transport block therebetween. The housing block is further adapted with camming means for influencing engagement between the DIP package contact legs and the contact spring finger portions as the transport block is inserted toward the housing block.

8 Claims, 4 Drawing Figures

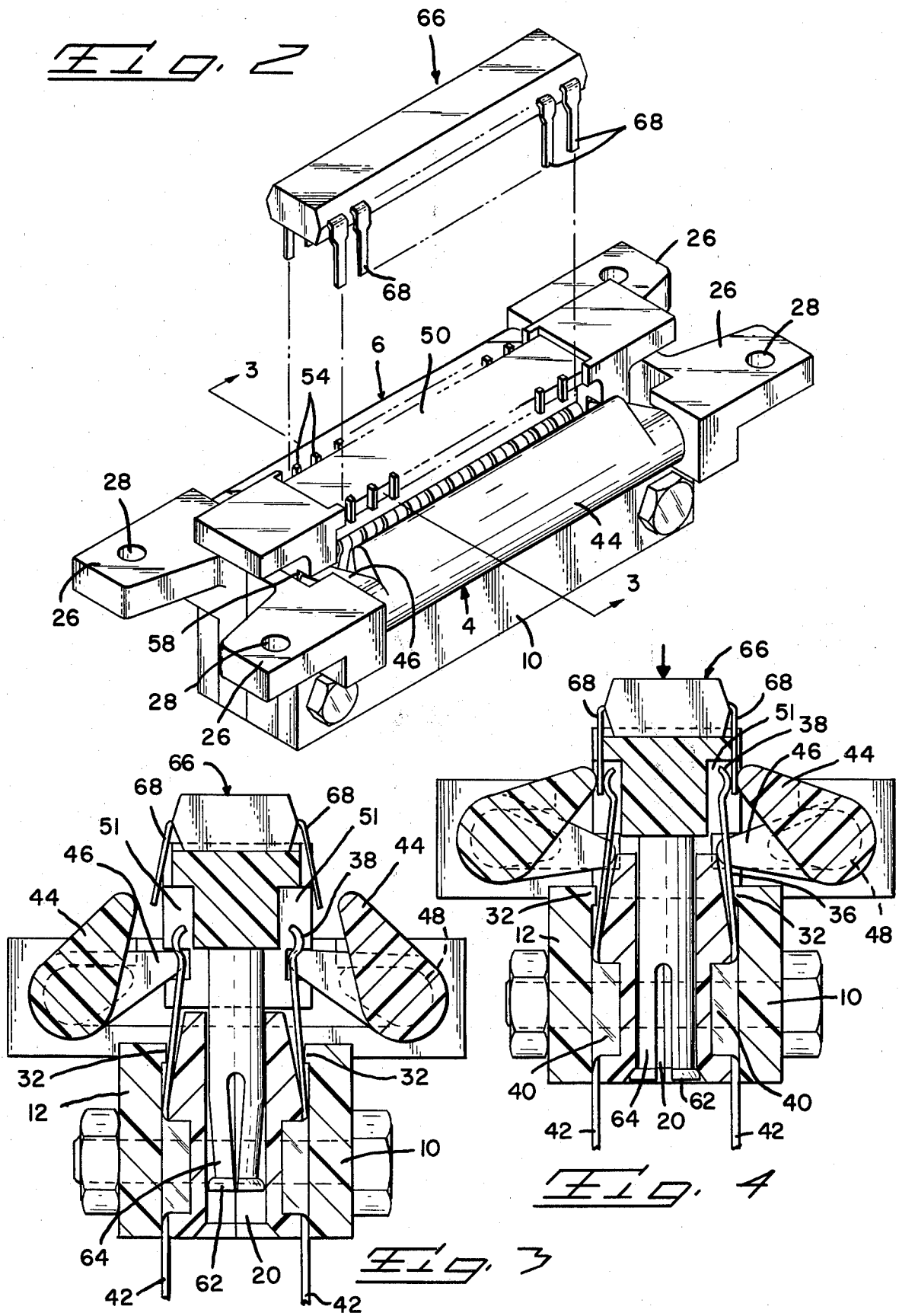

CAM ACTUATED DIP TEST SOCKET

BACKGROUND OF THE INVENTION

1. Field of the Invention

The present invention relates to test sockets for testing dual in-line electronics packages. Specifically, the present invention relates to zero entry force test sockets for receiving and electrically terminating the dual rows of contact members which depend from a DIP-style device.

2. The Prior Art

Dual in-line package is a common form of device within the electronics industry. Typically, such devices are mass-manufactured and then subsequently tested by way of a "burn-in" procedure in order to cull out defective components. Testing equipment for accomplishing this purpose generally provides a socket or receptacle for receiving a single DIP package, including contact means for electrically interfacing with the contacts of the DIP package.

Because the test receptacle in such equipment must withstand repeated cycles of package testing, difficulty has been experienced in achieving a test socket providing suitable durability. In particular, the contact in test sockets wear rather rapidly, and must be frequently replaced. However, since many currently available test sockets comprise contacts which are soldered directly to a printed circuit board, replacement is extremely difficult. Further, presently available test sockets do not readily accept DIP packages having variable width dimension. Still further, presently available test receptacles are relatively complicated, and comprising a substantial number of component parts. Consequently, the cost of these devices is comparatively high which reduces their acceptance in the market.

SUMMARY OF THE PRESENT INVENTION

The present invention relates to a zero entry force test socket suitable for receiving and electrically interconnecting with a dual in-line electronic package. The invention comprises a transport block receiving a DIP package thereon, with dual rows of contact legs of the DIP package positioned adjacent sides of the transport block. A housing block is further provided having dual rows of spring contacts loaded therein, having upwardly directed finger portion receiving a transport block therebetween. A pair of camming members are further included in the housing block, and serve to sequentially initiate engagement between the contact legs of the DIP package and the contact spring finger portions as the transport block is lowered toward the housing block. Thus, the present invention minimizes frictional engagement between contact components, to prolong the life of the contacts themselves. Also, the present invention includes housing structure for preliminarily loading the contact spring finger portions to enhance the contact forces, thereby ensuring positive electrical interconnection.

Accordingly, it is an object of the present invention to provide a zero entry force test socket for receiving and electrically interconnecting with a dual in-line electronic package.

A further object of the present invention is to provide a test socket for dual in-line packages, which operates by action of insertion and extraction of the DIP package.

Still further, an object of the present invention is to provide a zero entry force test socket comprising relatively few component parts, and providing positive spring contact means for ensuring the integrity of the electrical connection.

A still further object of the present invention is to provide a zero entry force test socket for dual in-line packages which is inexpensively and readily produced.

These and other objects, which will become apparent to one skilled in the art, are achieved by a preferred embodiment which is described in detail below and which is illustrated in the accompanying drawings.

BRIEF DESCRIPTION OF THE ACCOMPANYING DRAWINGS

FIG. 2 is a perspective view of the subject test socket, illustrated in the assembled condition, and shown having a DIP package appropriately positioned prior to location upon the transport block.

FIG. 3 is a transverse section view through the subject test socket illustrated in FIG. 2, taken along the line 3—3. FIG. 3 illustrates the DIP package in proper positionment upon the transport block, and illustrates the subject device prior to insertion of the transport block between the contact members of the housing block.

FIG. 4 is a transverse section view through the subject test socket, sequentially subsequent to the condition illustrated in FIG. 3. FIG. 4 illustrates the subject invention in an operating mode, with the transport block fully inserted into the housing block, and with the camming members pressuring contact legs of the DIP package against contact spring fingers of the test socket.

DETAILED DESCRIPTION OF THE PREFERRED EMBODIMENT

Figure 1:
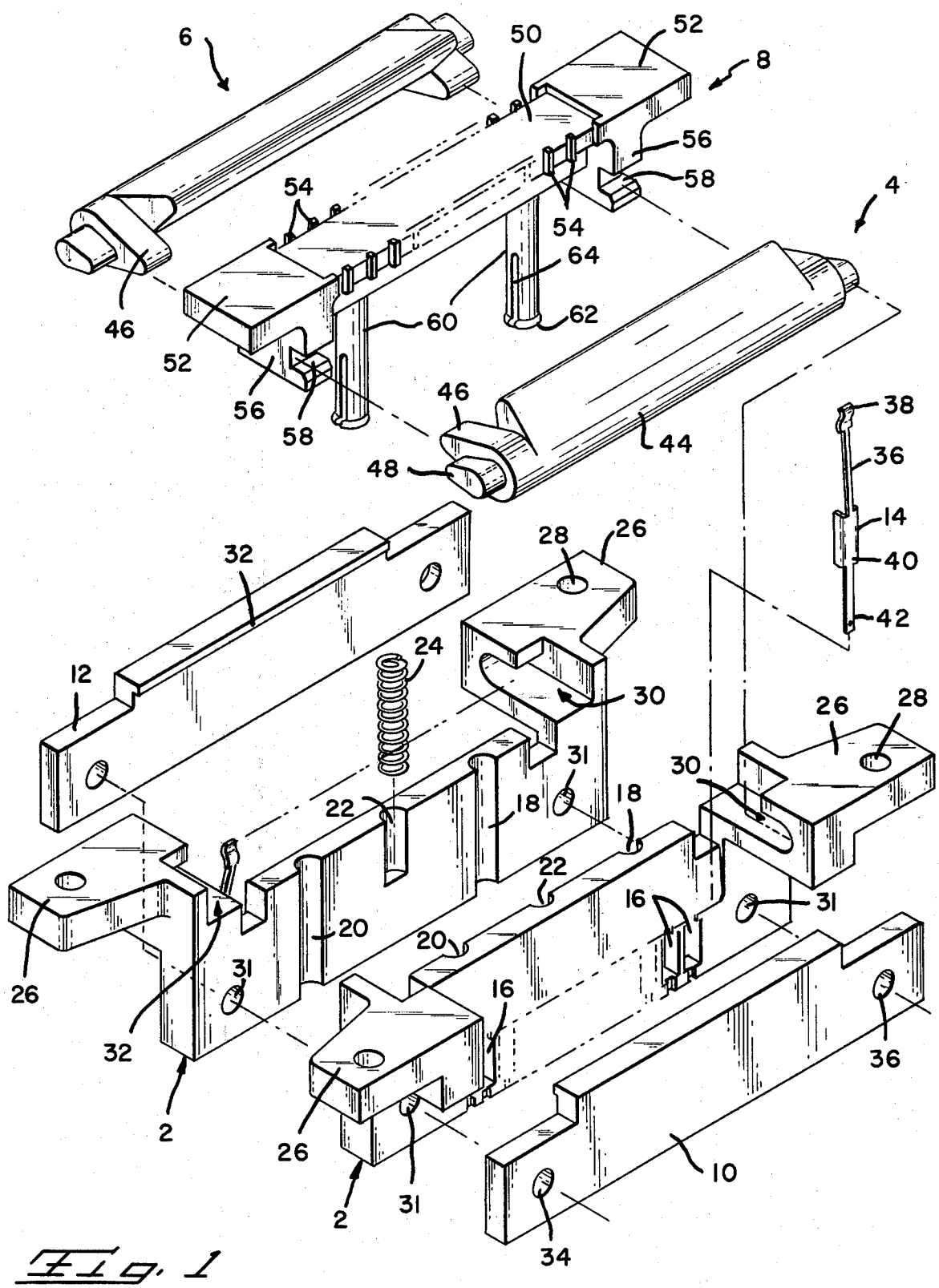
FIG. 1 is an exploded perspective view of the subject zero entry force test socket, illustrated in an unassembled condition.

Referring first to FIG. 1, the subject test socket is illustrated as comprising a housing block 2, shown unassembled, a pair of cam members 4,6, a transport block 8, a pair of side plates 10,12, and a plurality of contact springs 14. The housing block 2 is adapted having dual parallel rows of vertical contact receiving cavities 16, each of the contact cavities 16 being configured to receive one contact spring 14 therein. A pair of detent receiving passageways 18,20 extend through the housing block 2 in a transverse direction. Located parallel to, and intermediately between, the detent receiving passageways 18,20, is a spring receiving passageway 22 which is configured to receive a helical spring member 24 therein. Four mounting flanges 26 are provided to project outwardly from the four corners of the housing block 2, each mounting flange having a mounting aperture 28 extending therethrough. A pair of internal chambers 30,32 are provided at opposite ends of the housing block 2, and extend between the two mounting flanges 26 located at the end of the housing block. A pair of assembly apertures 31 extend through the housing block 2, at opposite ends thereof.

The side plates 10,12 each are of an elongate, generally rectangular configuration, and each providing a longitudinal lip projection 32 extending the length thereof. Each of the side plates likewise is provided with a pair of assembly apertures 34 at opposite ends which align with the assembly apertures 31 of the housing block 2.

Each of the plurality of contact springs 14 is adapted to provide a spring finger portion 36 having an arcuate profiled contact tip 38 at a remote end. The spring finger portion 36 is integral with an intermediate portion 40, which connects with a lower portion 42 representatively shown as a solder tab. It will be appreciated that the lower portion 42 may be configured as a post, solder tab, pin receptacle, etc., at the option of the user.

Each of the cam members 4,6 comprise a pressure surface portion 44 which extends substantially the entire intermediate length thereof, and which provides a three-sided transverse sectional profile. An actuator portion 46 is provided at each end of the cam members, and likewise is of a three-sided transverse sectional profile. A cam bearing stop portion 48 is provided at the remote ends of the cam members, and similarly is of a three-sided profiled configuration. It will be appreciated that the pressure surface portion 44 is arcuately rotated with respect to the actuator portions 46 and cam bearing portions 48 for a purpose described below.

The transport block 8 comprises a support surface 50 extending intermediately, and a pair of tab flanges 52 located at opposite ends of the support surface 50, for the purpose of providing means for manually grasping the transport block. A series of spaced-apart locator protrusions 54 are spaced along the side surfaces of the transport block as shown. It will be recognized from FIG. 3 that the support surface 50 extends outward from the transport block, defining a recess 51 therebeneath. Returning to FIG. 1, the transport block 8 is further adapted with depending block portions 56 at opposite ends, with the depending portions 56 each providing a horizontal slot 58 facing each of the opposite sides of the transport block. A pair of spaced-apart detent protrusions 60 depend from the transport block, each providing an annular detent protrusion 62 at the lower remote end thereof, which is integrally joined to a resilient slotted barrel portion 64.

Proceeding to FIG. 2, the subject test socket is intended to accommodate receipt of a dual in-line package 66, of the type in common use within the electronics industry. Such DIP package provide parallel rows of dependent contact legs 68 having a specified center line spacing, such as 0.100 of an inch. DIP packages come in a variety of widths, with typical widths being 0.300, 0.400 and 0.600 of an inch.

Assembly of the subject test socket is as follows, with reference to FIGS. 1, 2, and 3. The housing block 2 is assembled between the side plates 10,12, with the plurality of contact springs 14 loaded within the contact receiving cavities 16 of the housing block. So located, the contact springs 14 are captivated on all sides, with the spring finger portions 36 of the contact springs projecting upwardly. It will be recognized that the lip projection 32 of each of the side plates 10,12 engage the spring finger portions 36 of a respective row of contact springs 14, and impart an inward bias to the spring finger portions. Each of the cam members 4,6 is assembled to the housing block 2, with the cam bearing portions 48 of the cam members located within respective chambers 30 of the housing block. Cam members 4,6 are rotatable in this position, but only to a limited extent. The shape of the cam bearing 48, and the dimensions of the chambers 30 are such that the rotation of the cam bearing 48 is arcuately limited.

Continuing with the assembly of the subject invention, the transport block 8 is assembled to the housing block 2 by alignment of the detent projections 60 within the detent passageways 18,20, and engagement between the depending portions 56 of the transport block and the cam actuator portions 46. The remote ends of the cam actuator portions 46 are located within the slots 58 of the depending portions 56, and thereby mechanically coupled vertical motion of the transport block to rotation of the cam members. The presence of the transport block against the housing block places the spring 24 into compression, and the detent projections 60 reciprocally progress downward and upward within the detent passageways 18,20, by manual operation of the tab flanges 52 of the transport block.

As illustrated in FIG. 2, the DIP package 66 is positioned upon the support surface 50, with dependent contact legs 68 of the package located between adjacent locator protrusions 54. As best appreciated from FIG. 3, the depending contact legs 68 project adjacent to the sides of the transport block and are aligned to the outside of the contact spring fingers 36 of the housing block. The contact spring fingers 36 project into the recess 51 of the transport block as shown, and each depending leg 68 of the DIP package corresponds to a respective spring finger. At this stage in the operation of the subject invention, the pressure surface portions 44 of each cam member are rotated away from the transport block, and the cam bearing portion 48 of each cam member is in abuttment against the upper surface defining the chambers 30. Also, the detent projections 60 are within appropriate passageways 18,20, as shown, which passageways 18,20 providing means for alignment of the transport block.

Proceeding to FIG. 4, the transport block 8 is lowered downward by application of pressure to the body of the DIP package, and rotates the cams inward, instituting engagement between the pressure surface portions 44 of the cam and the dependent contact legs 68 of the DIP package. The cam forces the contact legs of the DIP package inward against the contact spring arcuate portions 38 at the bottom of the transport block's travel. Electrical connection is thereby established, and the detent projections 62 snap against the bottom surface of the housing block 2 to retain the transport block in its operating mode. The force of contact engagement is enhanced by operation of the lip projections 32 of the side plates 10,12, which operate to place the spring finger portions under a preliminary load. Also, it will be appreciated that frictional engagement between the dependent legs 68 of the DIP package and contact spring tip portions 38 is minimized since engagement therebetween occurs relatively instantaneously. Thus, the subject device operates under substantially zero entry force, and due to the minimization of frictional engagement between contact components, the device provides a considerable long contact operation life.

A pull upward on the tab flanges 52 overcome the detent, and returns the transport block to the top of its travel, moving the cams outward to release the DIP contact legs from their engagement with the spring fingers. The cam bearing geometry functions as a stop to limit the upward inch wide DIP dimensions, by using a filler block and a wider molded transport block if desired. Moreover, the subject device comprises relatively few components, yet achieves positive electrical contact in a manner which travel of the transport block.

The subject device cam accommodate 0.300, 0.400 and 0.600 inch wide DIP dimensions, by using a filler block and a wider molded transport block if desired. Moreover, the subject device comprises relatively few components, yet achieves positive electrical contact in a manner which does not abbreviate the cycle life of the contact surfaces.

It is to be understood that the above described preferred embodiment of the present invention is merely illustrative. Other embodiments, which will become apparent to one skilled in the art, and which utilize the teachings herein set forth, are intended to be within the scope and spirit of the subject invention.

What is claimed is:

1. A socket for a DIP package, comprising:
   transport block means for supporting the DIP package with parallel rows of depending contact legs of the DIP package located adjacent sides of said transport block means;
   a plurality of spring contacts;
   housing means receiving and locating said spring contacts in opposed rows, said spring contacts having upwardly directed finger portions arranged in dual and parallel rows, and defining a passageway therebetween for accommodating downward travel of said transport block means, each said DIP package leg located outside of and in alignment with a respective one said contact spring finger portion;
   camming means responsive to said downward travel of said transport block means, and engaging and influencing the DIP package contact legs against respective contact spring finger portions;
   said transport block means comprising an elongate body having an upper support surface receiving the DIP package thereon, and detent means for retaining said elongate body within said passageway in a fully inserted condition;
   said elongate body having an outwardly directed flange extending along each side longitudinal side thereof;
   said housing means including means for preloading said spring finger portions in a state of inward bias, with ends of said spring finger portions located generally below said elongate body flanges.

2. A socket as set forth in claim 1, wherein said camming means comprise a pair of elongate members, each rotatably mounted in said housing means and located parallel with and outside of a respective one of said dual rows of spring contact finger portions, each said elongate member having intermediate portion means and actuator means at opposite ends for engaging said transport block means upon insertion of said block means between said dual rows of spring contact finger portions, and initiating inward rotation of said intermediate portion means toward engagement with a respective row of the DIP package legs.

3. A socket as set forth in claim 2, wherein said intermediate portion means of each said elongate members have a three-sided transverse sectional profile.

4. A socket as set forth in claim 3, wherein said bearing means have a three-sided profile and being rotatably captivated within a chamber of said housing, profiled to permit limited rotation of said bearing means to limit upward travel of said transport block means.

5. A test socket for testing electrical components having a series of electrical terminals extending outwardly from respective sides thereof, comprising:
   housing means having rows of spring terminal means secured along respective sides;
   transport means mounted onto said housing means between said rows of spring terminal means and being movable relative to said housing means, said transport means having support surface means onto which an electrical component can be placed with the series of electrical terminals thereof being disposed in alignment with respective spring terminal means of said rows of spring terminal means;
   dielectric terminal-engaging means;
   mounting means provided by said terminal-engaging means and said housing means mounting said terminal-engaging means onto said housing means along said rows of spring terminal means and for movement of the terminal-engaging means relative to said housing means; and
   means pivotally connecting said terminal-engaging means to said transport means so that when said transport means is moved relative to said housing means with an electrical component on said support surface means, said pivotally connecting means moves said terminal-engaging means relative to both said housing means and transport means thereby causing the electrical terminals of the electrical component to be moved into electrical engagement with said spring terminal means.

6. A test socket as set forth in claim 5 wherein said terminal-engaging means engage the electrical terminals of the electrical component and urge the electrical terminals into electrical engagement with the spring terminal means.

7. A test socket as set forth in claim 5 wherein spring means are disposed between said housing means and said transport means.

8. A test socket as set forth in claim 5 wherein said housing means has passageway means, said transport means includes detent means disposed in said passageway means to align said housing means and said transport means and to maintain said transport means in an operative position with the electrical terminals in electrical engagement with said spring terminal means.

* * * * *